United States Patent
Elwart et al.

[11] Patent Number: 5,171,369
[45] Date of Patent: Dec. 15, 1992

[54] DEVICE FOR GLOW POTENTIAL PROCESSING, IN PARTICULAR IONIC CARBURATION

[76] Inventors: Jan Elwart, Kurt-Schumacher Str. 116, Erfstadt, Fed. Rep. of Germany, D5042; Wolfgang Rembges, Kantstrasse 34, Cologne, Fed. Rep. of Germany, D-5000

[21] Appl. No.: 654,637
[22] PCT Filed: Aug. 17, 1989
[86] PCT No.: PCT/DE89/00540
§ 371 Date: Feb. 19, 1991
§ 102(e) Date: Feb. 19, 1991
[87] PCT Pub. No.: WO90/02414
PCT Pub. Date: Mar. 8, 1990

[30] Foreign Application Priority Data
Aug. 18, 1988 [DE] Fed. Rep. of Germany ... 8810442[U]

[51] Int. Cl.$^5$ ............................................. C23C 16/00
[52] U.S. Cl. ............................. 118/723; 422/186.05; 422/186.06
[58] Field of Search ................... 118/723; 422/186.05, 422/186.06

[56] References Cited
U.S. PATENT DOCUMENTS
4,179,618 12/1979 Tanaka ............................... 148/16.6
4,221,972 9/1980 Oppel ................................ 148/16.5

FOREIGN PATENT DOCUMENTS
668639 7/1932 Fed. Rep. of Germany.
2403645 4/1979 Fed. Rep. of Germany.
3101351 8/1982 Fed. Rep. of Germany.
2091398 7/1982 France.

Primary Examiner—Richard Bueker
Attorney, Agent, or Firm—Eckert Seamans Cherin & Mellott

[57] ABSTRACT

In a device for glow potential processing the metallic workpieces are placed on an electroconductive charging plate. The device has an oven located within a chamber that can be evacuated. At least three supports of the charging plate are arranged in the inner space of the oven and a supply line for the electric connection of the charging plate opens into a glow potential. The supply line is composed of at least three support insulators that end below the charging plate. The supports or the at least three support insulators can be lifted and lowered, so that the charging plate rests on the supports only or on the support insulators only.

10 Claims, 2 Drawing Sheets

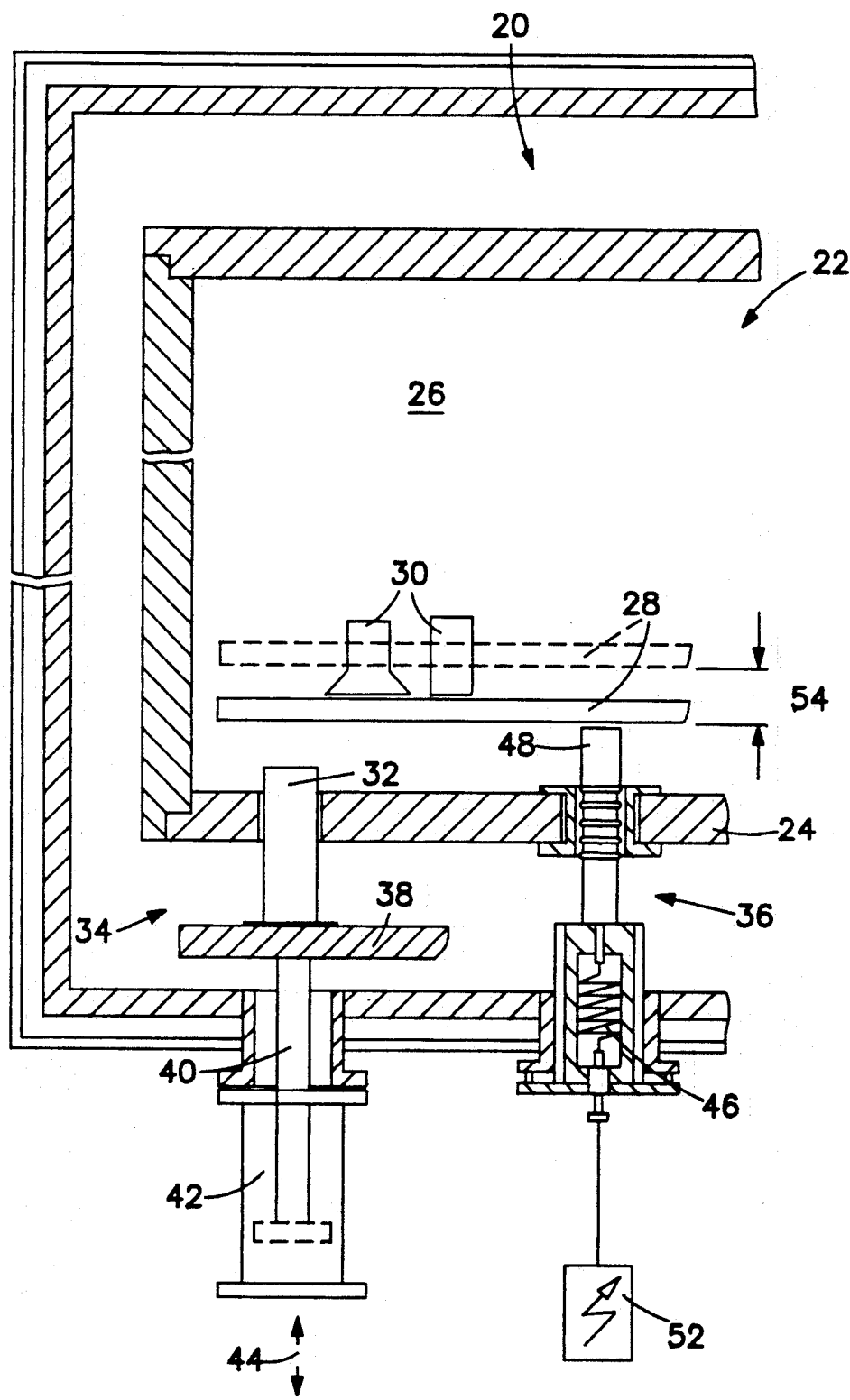

DEVICE FOR GLOW POTENTIAL PROCESSING, IN PARTICULAR IONIC CARBURATION

BACKGROUND OF THE INVENTION

1. Field of the Invention

The invention pertains to equipment for glow-discharge treatment in accordance with the characterizing clause of patent claim 1.

2. Prior Art

The technology of plasma carburization has been known for many years and was described, for example, in DE Patent 668,639. To ensure a stable glow discharge for the treatment in the furnace, the two electrodes of the glow potential (anode and cathode) are designed to be electrically insulated from the others parts of the equipment. However, this makes it necessary for the charging plate to be electrically separated from the other parts, at least during the glow treatment. In the equipment of the above-mentioned type that is described in U.S. Pat. No. 4,179,618, the charging plate rests on two electrically insulating supports, which are mounted on the base of the chamber that can be evacuated. Between the two supports, there is a support insulator, which is attached to an electrical bushing insulator and can be connected with a power source for the glow potential.

In the equipment described in German Patent 31 01 351, the charging plate is also supported in the furnace in an electrically insulated way; it is part of a carriage that can be moved in and out of the furnace chamber on electrically insulated rails. In its end position it comes into contact with the supply line for the electrical connection of the charging plate.

GB-A-2 091 398 describes equipment for glow-discharge treatment, in which the workpiece, before being treated, rests on a support that is used to move the workpiece in and out of the furnace. To perform the treatment, the workpiece is raised from the support by a lifting device, which simultaneously connects the workpiece with an electric supply line.

A disadvantage of these previously known types of equipment for glow-discharge treatment is that the charging plate is always supported in an electrically insulated way as long as it is located in the open inner space. This means that the electrical insulators are exposed and can thus become dirty, sooty etc. during the entire treatment operation, i.e., not merely during the actual glow-discharge treatment, so that a sparkover on one or the other insulator cannot be avoided after a certain amount of time.

Insulators for glow discharge treatment are also known (see, e.g., U.S. Pat. No. 4,221,972), in which fouling of the external, exposed surface of the insulator is supposed to be prevented by a large number of peripheral grooves and by gap effect. However, it has been found that the surfaces of these insulators also eventually become covered with a layer that possesses a certain amount of electrical conductivity. Compared to plasma nitriding, the problems encountered in plasma carburizing are more serious because the treatment temperature in the furnace is in a range at which ceramic materials are usually already beginning to conduct. Therefore, the insulators must be located outside the furnace or they must be cooled; however, this leads to additional problems.

The previously known types of equipment have still another important disadvantage, which arises during the heating of the charging plate and when more than one support insulator is present. The charging plate and the workpieces it supports are introduced at room temperature into the chamber that can be evacuated or its furnace. In the furnace it is heated to a temperature of about 1000° C. which causes strong expansion. This in turn produces a transverse load on the supports that support the charging plate. In typical equipment of the type described at the beginning, the charging plate, including the workpieces it holds, weighs perhaps one metric ton. This means that each support must bear a load of several hundred kg, depending on its design. The transverse load described above must also be considered when the charging plate undergoes thermal expansion. This load often leads to the buckling, breaking off or lateral cracking of the supports.

To summarize, the disadvantages of the previously known equipment of this type are, first, that the supports must remain electrically insulating for as long a time as possible, and second, that the supports must be designed to withstand mechanical loads, especially transverse loads during the thermal expansion and subsequent contraction of the charging plate. Standard ceramic materials are unable to withstand these loads. Therefore, in equipment of the types described above, the insulating supports must be replaced relatively frequently because they have been mechanically destroyed or are no longer electrically insulating. This means a lengthy operational shutdown in either case.

Therefore, the goal of the invention was to develop equipment of the type described at the beginning in such a way that the supports would have significantly longer service life, preferably a practically unlimited service life, and that the insulators would be subject to as little mechanical stress as possible and would be well protected from soiling.

This goal is accomplished by connecting the supply line to a head section of at least one support insulator, which terminates below the charging plate; furthermore, the one or more supports or the one or more support insulators can be moved up and down, so that the charging plate rests only on the one or more supports or only on the head sections of the one or more support insulators.

SUMMARY OF THE INVENTION

In accordance with the invention, the charging plate rests on the one or more support insulators only during the actual glow-discharge treatment, and it rests on the one or more supports during the remainder of the treatment time, which is usually much longer than the time for the actual glow-discharge treatment. This has the advantage that the supports themselves no longer have to be insulating and must merely be designed to withstand mechanical stresses, especially transverse forces during thermal expansion. Since there is no longer any necessity of the supports to be electrically insulating, one is free to select the material for the top portion of the support, which comes into contact with the underside of the charging plate, on the basis of mechanical properties and can use a material or construction that is not sensitive to transverse forces. In this way, it is possible to design supports that hardly ever have to be replaced or at least do not become defective during normal operation.

The support insulators themselves are brought into contact with the charging plate only when the plate is at treatment temperature. Therefore, they do not have to absorb transverse forces, such as those arising during thermal expansion, and thus are not mechanically stressed in the transverse direction. This makes it possible to design the support insulators better and more purposefully with respect to their actual purpose of maintaining insulating capacity for as long as possible. When support insulators that can be moved up and down are used, there is the additional advantage that they can be placed in a protected position during the period of time that the glow-discharge treatment is not being performed, i.e., their surfaces can be protected from contamination during the processes occurring when the glow-discharge treatment is not being performed. The invention thus makes it possible to increase significantly the service life of the supports and support insulators and to avoid the need to replace them frequently, e.g., after only one or a few charges, as is the case in previously known equipment of this type. This eliminates the necessity of shutting down the equipment to replace the supports and support insulators; in addition, there are savings of installation time and materials. However, the invention offers the special advantage that the failure of a support or support insulator during the treatment of a charge is virtually eliminated, i.e., there is no longer any reason to fear termination of the treatment of a charge due to the failure of a support or support insulator.

In a preferred design of the invention that was briefly mentioned above, the support insulators can be moved up and down, and in their lowest position they are located in a protective casing that protects them from contamination by gases and dust located in the chamber that can be evacuated. As they are being moved towards the upper position, they come into contact with the underside of the charging plate and lift it from the supports, so that the charging plate now rests only on the support insulators. In this position they are outside of their protective casings, so that they can perform their insulating function; contamination is possible at this time but is limited to the duration of the glow-discharge treatment.

It has been found to be especially advantageous to design the support insulators to be elastic transverse to the plane of the charging plate. In this way, the upper segments of all of the support insulators always rest against the underside of the charging plate, even if the movement strokes of the support insulators have changed slightly, or the charging plate has deformed due to thermal expansion or has inherent dimensional variations.

Finally, it has been found to be very advantageous to provide several sets or at least two sets of support insulators, such that each set can be moved up and down independently of the other sets. If one support insulator in a set of support insulators should fail, which usually occurs as a result of contamination of its outer surface another set of support insulators can be used without having to interrupt the treatment of the charge presently in the furnace or the treatment of several charges. This is especially advantageous when the charges to be treated must be finished by a certain deadline, as is often the case in hardening shops.

Finally, in a modification of the equipment of the invention, the support insulators are mounted in a vacuum lock, so that they can be changed during normal operation without having to break the vacuum.

It has been found to be very advantageous for the head of the support to be made of graphite. Graphite has a lubricating effect, so that transverse movements of the charging plate during thermal expansion do not lead to transverse forces within the support and especially within the graphite head.

It is possible to combine the supports and the support insulators. In this case, the support insulators are located inside the tubular or cup-shaped supports. In the lower position of the charging plate the supports rest on the base of the furnace or the base of the chamber that can be evacuated. The support insulators are fully enclosed and shielded by these tubular or cup-shaped supports. They are preferably not in contact with the support or the charging plate, so that they are not stressed by transverse forces. When the support insulators are raised, they take the cup-shaped supports with them, whereas tubular supports remain on the bottom of the furnace or chamber. The supports then no longer play any role, and the charging plate rests solely on the support insulators.

Other advantages and features of the invention are described in the secondary claims. The invention will now be described in greater detail with reference to the specific embodiment illustrated in the drawings. It is understood that the invention is in no way limited by this example.

BRIEF DESCRIPTION OF THE DRAWINGS

FIG. 2 shows the same cross section as in FIG. 1, but with the charging plate in the upper position, i.e., the position for the glow-discharge treatment.

DETAILED DESCRIPTION OF THE PREFERRED EMBODIMENTS

Figure 1:
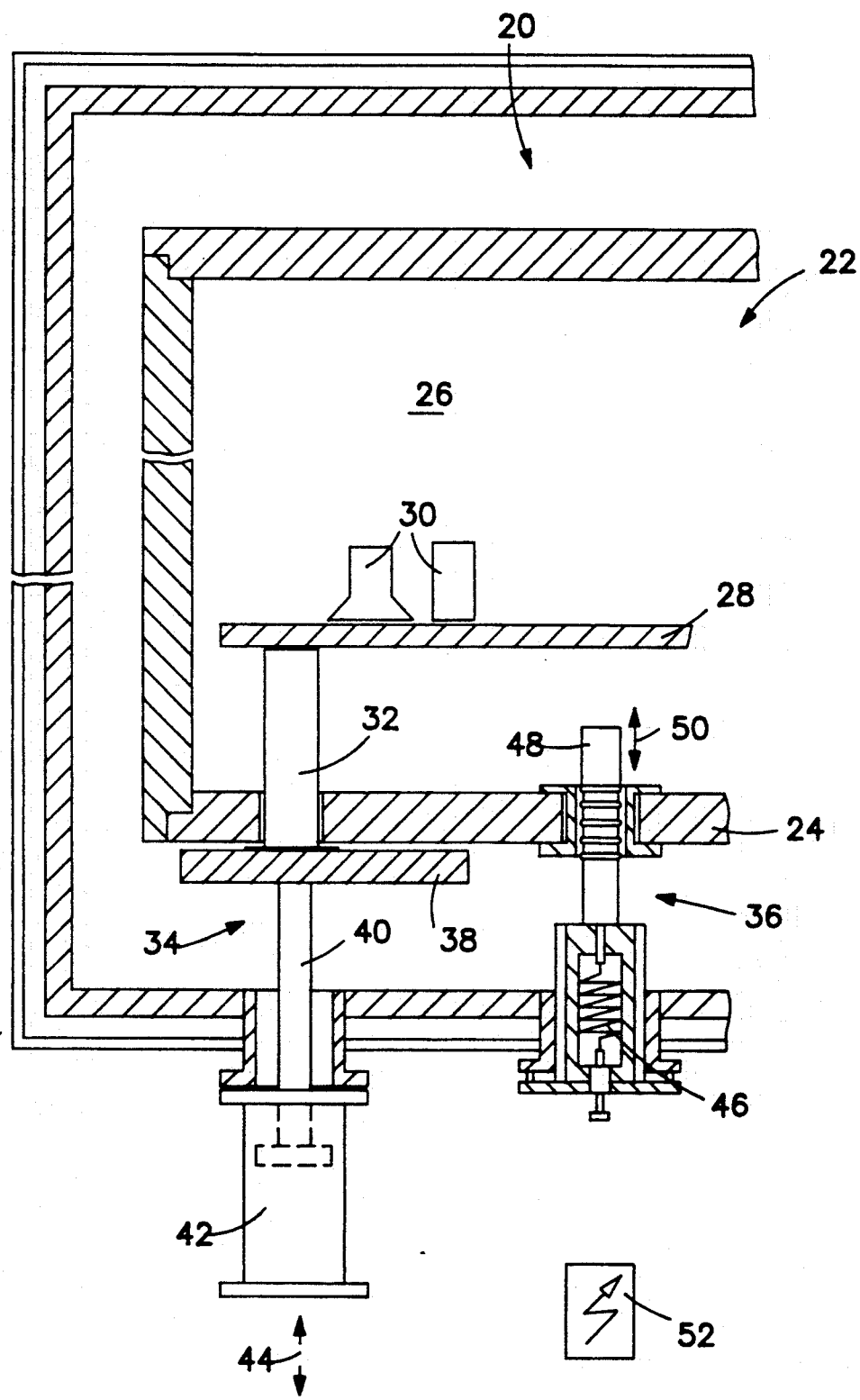
FIG. 1 shows a lateral cross section through a furnace, in which the charging plate is located in the lower position.

Inside a chamber 20, which can be evacuated, there is a furnace 22, whose heater, which is typically an electric heater, is not shown here. In the specific embodiment shown here the furnace is cubic. It has a base 24, and its interior space is labeled 26. A charging plate 28 is located within this interior space, and two work pieces 30 are shown on the charging plate for the purpose of illustration.

The head 32 of a support 34 and a support insulator 36, which is described in greater detail below, extend through openings in the base 24 of the furnace 22. The head portion 32 is made of graphite. Below the head there is a stop plate 38, which is located immediately beneath the exterior surface of the base 24 in the upper position of the charging plate 28 shown in FIG. 1. Below the charging plate and coaxially below the head 32, the support 34 has a rod 40 which is part of a lifting device 42. The rod 40 and thus the entire support 34 can be moved up and down as indicated by the double arrow 44; in FIG. 1 the rod 40 is in its upper position.

FIG. 1 shows the state of the equipment when the glow-discharge treatment is not being performed. The charging plate 28 and its workpieces 30 are supported solely by the one support 34 shown in the drawing. All together, there are at least three supports. The support insulator 36 does not touch the charging plate 28, but rather is clearly separated from the charging plate, as FIG. 1 shows. The support insulator is designed in accordance with the state of the art, but in addition it has an axially arranged and thus vertically acting spring 46, which supports the head 48 of the support insulator 36. This makes it possible to move the head 48 in the direction of the double arrow 50. In the drawing shown in FIG. 1, the head 48 is in its upper position, since it is not supporting a load. When a load is applied, the head moves down against the tension of the spring. A power source 52 is provided for the glow-discharge treatment. However, as FIG. 1 shows, the power source is not connected to the support insulator 36.

In the specific embodiment shown in FIG. 2, the charging plate 28 and its workpieces are supported solely on the support insulator 36; since there are at least three support insulators 36, only one of which is shown in the drawing, the charging plate is completely supported.

To arrive at the state shown in FIG. 2, the lifting device 42 has been moved down, causing the charging plate 28 to fall until it comes into contact with the heads 48 of the support insulators 36. The springs 46 are compressed under this load in such a way that all of the support insulators 36 are in contact with the underside of the charging plate 28. In the further course of the downward movement of the lifting device 42, the supports 34 have been lowered far enough that their head sections 32 are well below the charging plate 28. The range of movement of the charging plate is indicated by reference number 54 in FIG. 2; this range of movement is only bout half the range of movement of the lifting device 42.

In the specific embodiment shown in FIG. 2, the support insulator 36 is connected with the power source, so that the glow-discharge treatment can now be performed.

We claim:

1. Equipment for the glow-discharge treatment of metal workpieces placed on an electrically conducting charging plate in a furnace, which is located inside a chamber that can be evacuated, in whose open inner space there is at least one support for the charging plate and into which a supply line opens for the electrical connection of the charging plate to the glow potential, characterized by the fact that the supply line is connected to a head section of at least one support insulator that terminates below the charging plate, and that the one or more supports or the one or more support insulators can be moved up and down, so that the charging plate rests either only on the one or more supports or only on the head sections of the one or more support insulators.

2. Equipment in accordance with claim 1, characterized by the fact that the one or more supports are electrically conducting.

3. Equipment in accordance with claim 1, characterized by the fact that the head sections of the one or more supports are made of graphite.

4. Equipment in accordance with claim 1, characterized by the fact that the one or more support insulators can be moved up and down and have casings that enclose and shield them in their lower position and do not enclose them in their upper position.

5. Equipment in accordance with claim 1, characterized by the fact that there are several sets of support insulators and that each set can be moved up and down independently.

6. Equipment in accordance with claim 1, characterized by the fact that the one or more supports and at least the head sections of the one or more support insulators move perpendicularly to the plane of the charging plate.

7. Equipment in accordance with claim 1, characterized by the fact that the one or more support insulators have a head section that is elastically supported in the direction transverse to the charging plate.

8. Equipment in accordance with claim 1, characterized by the fact that at least three support insulators are provided.

9. Equipment in accordance with claim 1, characterized in that at least three supports are provided.

10. Equipment in accordance with claim 1, characterized by the fact that it is designed as equipment for plasma carburization.

* * * * *